United States Patent
Chen et al.

(10) Patent No.: US 7,663,425 B2
(45) Date of Patent: Feb. 16, 2010

(54) FUSE OPTION CIRCUIT

(75) Inventors: Yu-Ren Chen, Hsinchu (TW);
Chun-Yao Liao, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 0 days.

(21) Appl. No.: 12/313,874

(22) Filed: Nov. 24, 2008

(65) Prior Publication Data

US 2009/0128226 A1    May 21, 2009

Related U.S. Application Data

(62) Division of application No. 11/888,137, filed on Jul. 30, 2007, now Pat. No. 7,532,058.

(30) Foreign Application Priority Data

Sep. 12, 2006   (TW) ............................... 95133766 A

(51) Int. Cl.
*H01H 37/76* (2006.01)
(52) U.S. Cl. ..................... 327/525; 327/526; 327/217
(58) Field of Classification Search .............. 327/525, 327/526, 217; 365/96, 225.7
See application file for complete search history.

(56) References Cited

U.S. PATENT DOCUMENTS

| 6,154,388 A * | 11/2000 | Oh ............................ 365/225.7 |
| 6,480,430 B2 * | 11/2002 | Sato ......................... 365/225.7 |
| 7,532,058 B2 * | 5/2009 | Chen et al. .................. 327/525 |

* cited by examiner

*Primary Examiner*—Long Nguyen
(74) *Attorney, Agent, or Firm*—Haverstock & Owens LLP

(57) ABSTRACT

A fuse option circuit including a fuse, a control switch, a latch, and a logical operational controller is provided. The latch stores a selected level. The logical operational controller outputs a selected result signal and feedbacks a control signal to the control switch. The level of the control signal determines whether the control switch is on or off. Therefore, the required level is input to the latch and the working mode having an ultra low current is selected. Furthermore, when the fuse is in an untrimmed state, the level of the selected result signal could be selected by a reset pulse signal of the latch in order to test a product. Afterward, it is determined whether the fuse is trimmed or not. When the fuse is in a trimmed state, the level of the selected result signal is established by a rising edge of the reset pulse signal.

7 Claims, 6 Drawing Sheets

FUSE OPTION CIRCUIT

This is a divisional of U.S. patent application Ser. No. 11/888,137, filed Jul. 30, 2007, now U.S. Pat. No. 7,532,058, the contents of which are hereby incorporated by reference.

FIELD OF THE INVENTION

The present invention relates to a fuse option circuit, and more particularly to a fuse option circuit for the integrated circuit.

BACKGROUND OF THE INVENTION

A fuse is a circuit component, which is connected in series with a transmission line, and is used to short-circuit or open-circuit the transmission line.

The fuse has been widely used in the integrated circuit. For example, two terminals of a resistor are connected in parallel with a fuse. Whether the resistance value of the circuit is increased is determined by whether the fuse is burned off or not. Therefore, the difference between the predicted value obtained from a simulation circuit and the measured value obtained from an actual circuit could be remedied, and thus the required design specification is achieved.

Additionally, in order to increase the yield rate of a semiconductor memory device such as the static random access memory (SRAM), a redundant memory array and an option circuit containing fuses were provided. After memory cells in the memory device had been manufactured and defect cells were found by testing, the option circuit uses the fuses to join the redundant memory array in and to isolate the defect cells, so as to achieve the remedy effect.

Please refer to FIG. 1A, which is a schematic diagram showing the layout of a conventional option circuit. As FIG. 1A shows, the option circuit 11 includes a voltage source node 111 coupled to a voltage source potential Vdd, a ground node 112 coupled to a ground potential GND, and a selection node 113 coupled to an output terminal Vout. When the selection node 113 is connected to the voltage source node 111, the output terminal outputs the voltage source potential Vdd. When the selection node 113 is connected to the ground node 112, the output terminal outputs the ground potential GND.

However, the aforementioned conventional layout is difficult in the fabrication process to achieve that the selection node 113 not only might be connected to the voltage source node 111 but also might be connected to the ground node 112. Generally in this situation, either modifying one layer of photomask or a fabrication process of filling code is required to solve the selection problem, but the testing time or the fabrication cost is increased.

Furthermore, please refer to FIG. 1B, which is a schematic diagram showing the layout of another conventional option circuit. As FIG. 1B shows, the option circuit 12 includes a P-channel metal-oxide-semiconductor (PMOS) field-effect transistor 121 and a fuse 122. A first terminal of the fuse 122 is coupled to a ground potential GND. A drain terminal of the PMOS field-effect transistor 121 is coupled to a voltage source potential Vdd. A gate terminal and a source terminal of the PMOS field-effect transistor 121, and a second terminal of the fuse 122 are all coupled to an output terminal, and the PMOS field-effect transistor 121 is equivalent to a resistor having a large resistance value. When the fuse 122 is in an untrimmed state, the output terminal obtains the ground potential GND through the fuse 122. When the fuse 122 is in a trimmed state, the output terminal obtains a high logical level through the PMOS field-effect transistor 121.

However, defects of the aforementioned conventional layout follow. When the fuse 122 is in the untrimmed state, a large current Io flows in the PMOS field-effect transistor 121, thereby resulting in power dissipation. When the fuse 122 is in the trimmed state, the large current Io vanishes. Therefore, the magnitude of the large current Io is related to whether the fuse 122 is trimmed, which influences the current measurement when the integrated circuit including the option circuit 12 is measured in a stable state.

In sum, the layout of a suitable option circuit should avoid modifying one layer of photomask, avoid adding the cost for the fabrication process of filling code, or avoid generating a large current. Either of the prior arts has its drawbacks and doesn't meet the required effect. Therefore, how to improve the drawbacks of the aforementioned prior arts becomes the primary motive of the present invention.

SUMMARY OF THE INVENTION

It is therefore an aspect of the present invention to provide a fuse option circuit including a fuse, a control switch, a latch, and a logical operational controller. According to whether the fuse is trimmed, a required logical level is selected. Besides, an ultra-low current is kept when the fuse is in the untrimmed working state.

It is therefore another aspect of the present invention to provide a fuse option circuit including a fuse, a control switch, a latch having a reset input terminal, and a logical operational controller. When the fuse is in the untrimmed state, a required logical level is selected in accordance with the logical level of the reset input terminal for conveniently testing the actual status of a product. Then, it is determined as to whether the fuse needs to be trimmed, and the time for testing and developing the product is shortened.

According to the foregoing aspects of the present invention, a fuse option circuit is provided. The fuse option circuit includes a fuse, a voltage source control switch, a latch, and a logical operational controller. The fuse is selectively coupled to a ground potential. The voltage source control switch has a first terminal coupled to a voltage source potential, a second terminal coupled to the fuse, and a control terminal having a voltage level and selectively conducting the first terminal and the second terminal based on the voltage level. The latch has a set input terminal coupled to both the fuse and the voltage source control switch, and a reset input terminal receiving a reset pulse signal and outputs a driving signal. The logical operational controller is electrically coupled to the latch and the control terminal for outputting a control signal fedback to the voltage source control switch by operating the driving signal and outputting a selected result signal.

Preferably, when the voltage level is a high logical level, the first terminal is electrically connected to the second terminal, and when the voltage level is a low logical level, the first terminal is electrically disconnected from the second terminal. The logical operational controller includes a first input terminal coupled to the latch, a first output terminal coupled to the control terminal for outputting a control signal fedback to the voltage source control switch, and a second output terminal for outputting a selected result signal.

The aforementioned latch further includes a first NAND gate, a first NOT gate, a second NAND gate, and a second NOT gate. The first NAND gate has a first input terminal and a first output terminal, and is coupled to both the fuse and the voltage source control switch for executing a NAND operation. The first NOT gate receives the reset pulse signal for executing a NOT operation. The second NAND gate has a second input terminal electrically coupled to the first NOT gate, a third input terminal electrically coupled to the first output terminal, and a second output terminal coupled to the first input terminal for forming a bistable latch with the first NAND gate and outputting a latch signal. The second NOT gate is electrically coupled to the second NAND gate for stabilizing a voltage level of the latch signal and inverts the latch signal for generating the driving signal.

Preferably, when the fuse is coupled to the ground potential, a logical level inverted state of the reset pulse signal causes a logical level of the driving signal to be inverted. When the fuse is not coupled to the ground potential, a rising edge of the reset pulse signal causes an establishment of a logical level of the driving signal. The control signal is a first inverted state of the driving signal and the selected result signal is a second inverted state of the driving signal.

According to the foregoing aspects of the present invention, another fuse option circuit is provided. The fuse option circuit includes a fuse, a ground control switch, a latch, and a logical operational controller. The fuse is selectively coupled to a voltage source potential. The ground control switch has a first terminal coupled to a ground potential, a second terminal coupled to the fuse, and a control terminal having a voltage level and selectively conducting the first terminal and the second terminal based on the voltage level. The latch has a set input terminal coupled to both the fuse and the ground control switch, and a reset input terminal receiving a reset pulse signal and outputting a driving signal. The logical operational controller is electrically coupled to the latch and the control terminal for outputting a control signal fedback to the ground control switch by operating the driving signal and outputting a selected result signal.

The aforementioned latch further includes a first NOR gate, a second NOR gate, and a NOT gate. The first NOR gate has a first input terminal and a first output terminal, and is coupled to both the fuse and the ground control switch for executing a NOR operation. The second NOR gate receives the reset pulse signal and has a second input terminal electrically coupled to the first output terminal, and a second output terminal coupled to the first input terminal for forming a bistable latch with the first NOR gate and outputting a latch signal. The NOT gate is electrically coupled to the second NOR gate for stabilizing a voltage level of the latch signal and inverting the latch signal for generating the driving signal.

Preferably, the control signal of the logical operational controller is in a state identical to the driving signal, and the selected result signal is an inverted state of the driving signal.

The foregoing and other features and advantages of the present invention will be more clearly understood through the following descriptions with reference to the drawings, wherein:

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1A:
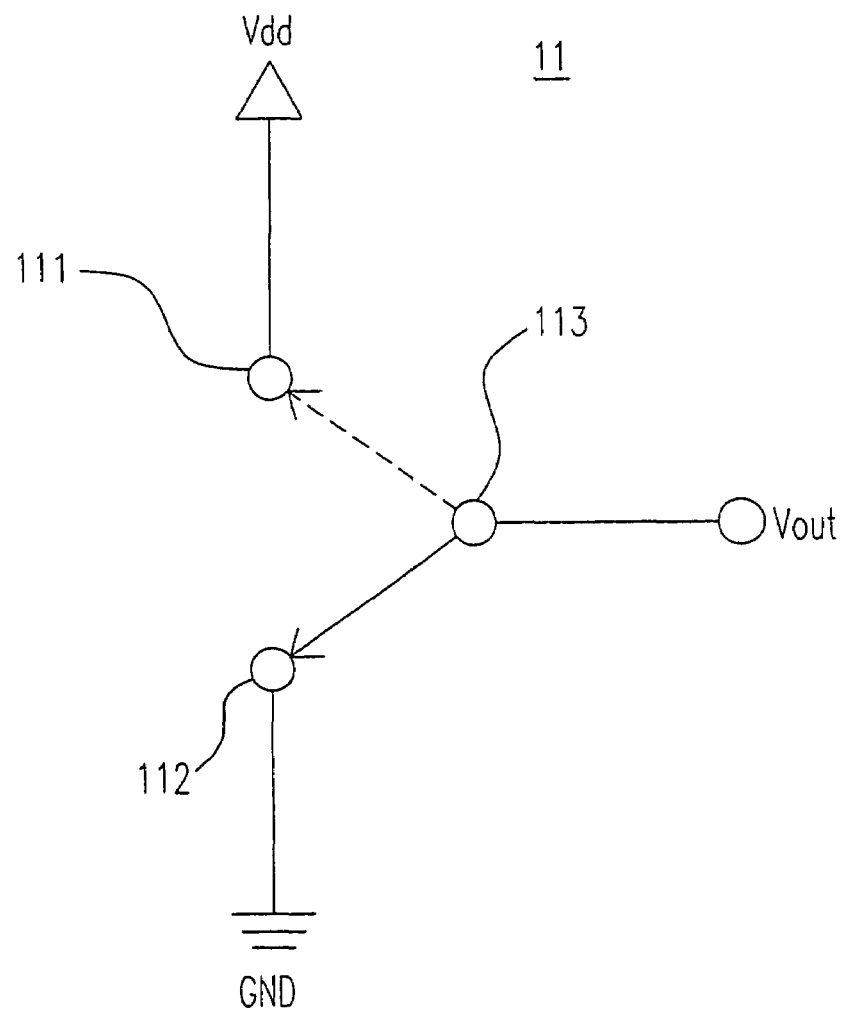
FIG. 1A is a schematic diagram showing the layout of a conventional option circuit.
Figure 1B:
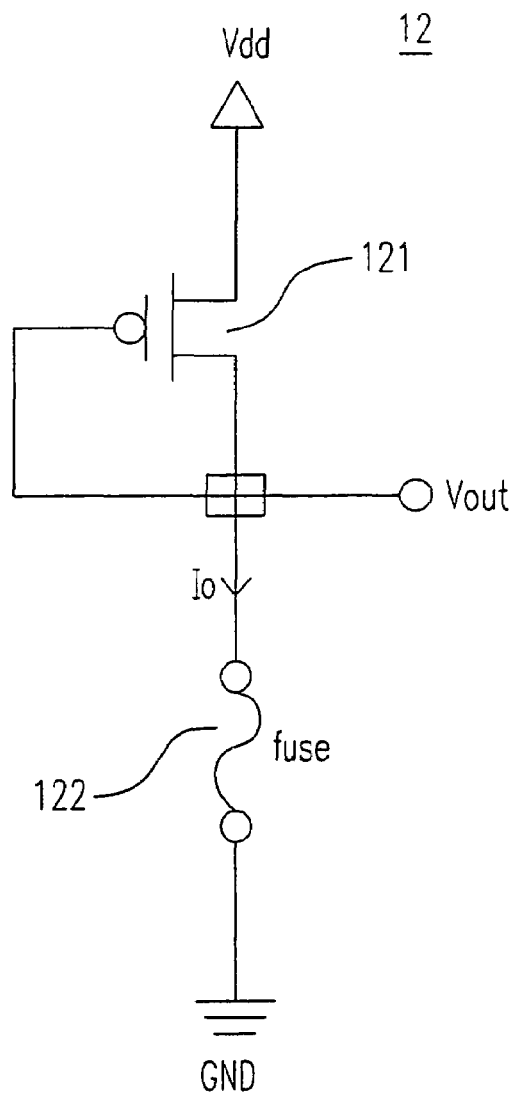
FIG. 1B is a schematic diagram showing the layout of another conventional option circuit.
Figure 2:
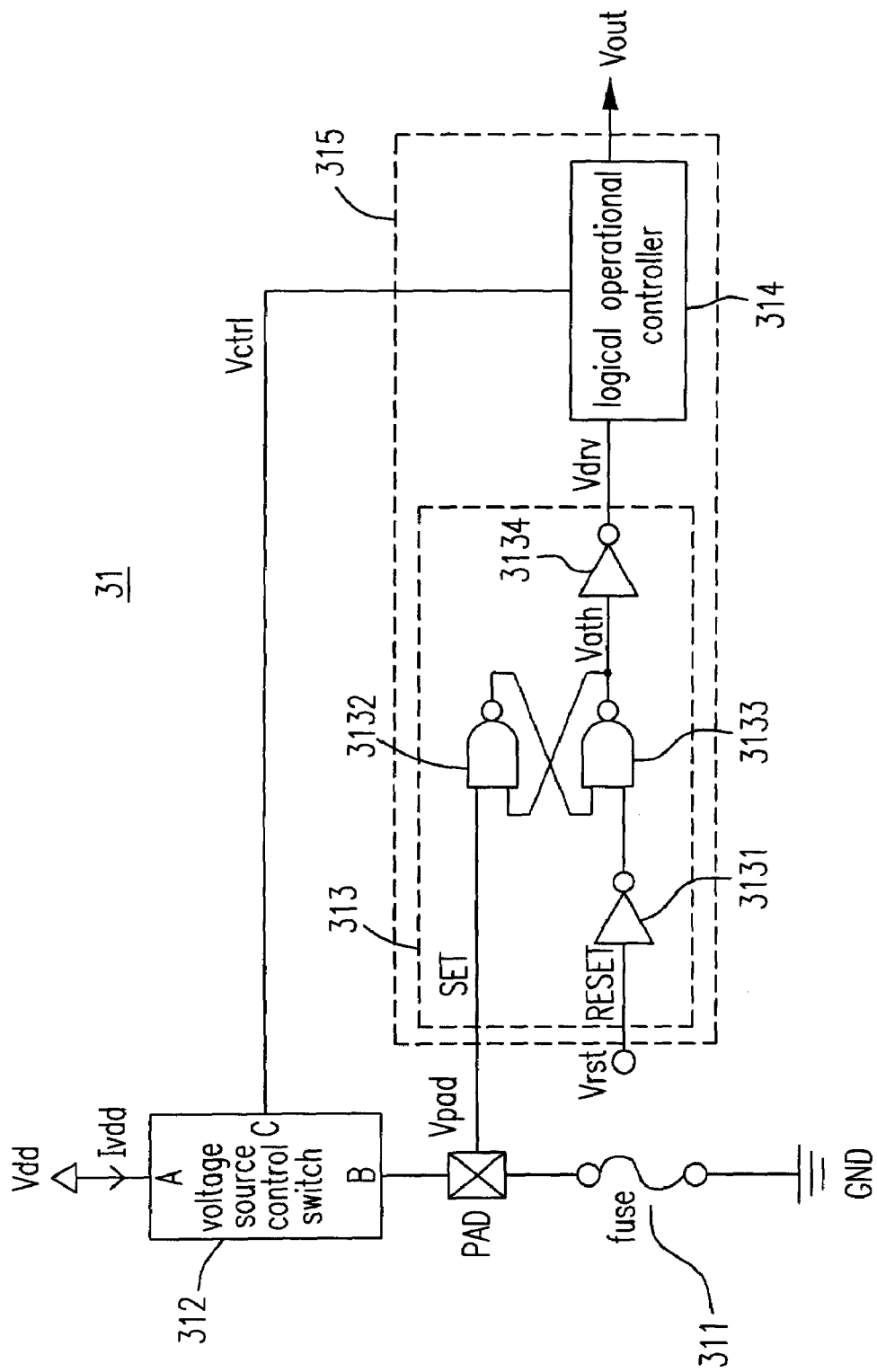
FIG. 2 is a circuit block diagram showing a fuse option circuit according to the first embodiment of the present invention.

Please refer to FIG. 2, which is a circuit block diagram showing a fuse option circuit according to the first embodiment of the present invention. As FIG. 2 shows, the fuse option circuit 31 includes a fuse 311, a voltage source control switch 312, a latch 313, and a logical operational controller 314. The fuse 311 is selectively coupled to a ground potential GND; that is, the fuse 311 is coupled to the ground potential GND when the fuse 311 is in an untrimmed state, and the fuse 311 is not coupled to the ground potential GND when the fuse 311 is in a trimmed state. The voltage source control switch 312 has a first terminal A, a second terminal B, and a control terminal C. The first terminal A is coupled to a voltage source potential Vdd. The second terminal B is coupled to the fuse 311. The control terminal C has a voltage level and selectively conducts the first terminal A and the second terminal B based on the voltage level. When the voltage level is a high logical level, the first terminal A is electrically connected to the second terminal B, and when the voltage level is a low logical level, the first terminal A is electrically disconnected from the second terminal B.

The latch 313 has a set input terminal SET and a reset input terminal RESET. The set input terminal SET is coupled to both the fuse 311 and the second terminal B of the voltage source control switch 312, and the common connection node is a welded pad PAD. The reset input terminal RESET receives a reset pulse signal Vrst. The latch 313 operates the reset pulse signal Vrst and outputs a driving signal Vdn. The input terminal of the logical operational controller 314 is coupled to the latch 313 and receives the driving signal Vdrv. The first output terminal of the logical operational controller 314 is coupled to the control terminal C of the voltage source control switch 312. The logical operational controller 314 operates the driving signal Vdrv and outputs both a control signal Vctrl and a selected result signal Vout. The control signal Vctrl is output from the first output terminal and is fedback to the voltage source control switch 312. The selected result signal Vout is output from the second output terminal of the logical operational controller 314.

The latch 313 and the logical operational controller 314 are further combined as a selection control unit 315. The selection control unit 315 has the set input terminal SET coupled to both the fuse 311 and the voltage source control switch 312, the reset input terminal RESET receiving the reset pulse signal Vrst, the first output terminal coupled to the control terminal C for outputting the control signal Vctrl fedback to the voltage source control switch 312, and a second output terminal for outputting the selected result signal Vout.

In FIG. 2, the latch 313 includes a first NAND gate 3132, a first NOT gate 3131, a second NAND gate 3133, and a second NOT gate 3134. The first NAND gate 3132 has a first input terminal, a first output terminal and the set input terminal SET coupled to both the fuse 311 and the second terminal B of the voltage source control switch 312 for executing a NAND operation. The first NOT gate 3131 has the reset input terminal RESET receiving the reset pulse signal Vrst for executing a NOT operation. The second NAND gate 3133 and the first NAND gate 3132 make up a bistable latch. The second NAND gate 3133 has a second input terminal electrically coupled to the first NOT gate 3131, a third input terminal electrically coupled to the first output terminal of the first NAND gate 3132, and a second output terminal coupled to the first input terminal of the first NAND gate 3132 for outputting a latch signal Vath. The second NOT gate 3134 is electrically coupled to the second NAND gate 3133 for stabilizing a voltage level of the latch signal Vath and inverting the latch signal Vath for generating the driving signal Vdrv.

Figure 3A:
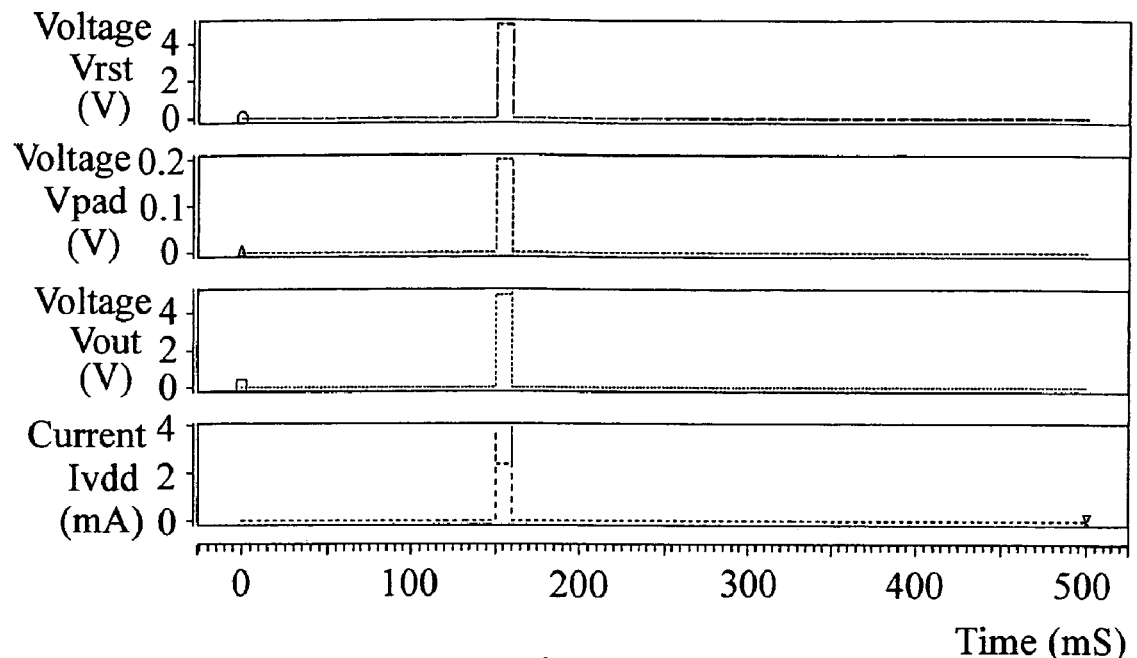
FIG. 3A is a waveform diagram showing signals where the fuse is in an untrimmed state according to the first embodiment of the present invention.

Please refer to FIG. 3A, which is a waveform diagram showing signals where the fuse is in an untrimmed state according to the first embodiment of the present invention. As FIG. 2 and FIG. 3A show, the fuse 311 is in the untrimmed state. In an initial state, the reset pulse signal Vrst is at a low logical level. A set logical level Vpad is a low logical level through the fuse 311, which causes the latch signal Vath to be at a low logical level and the driving signal Vdrv to be at a high logical level. The logical operational controller 314 operates the driving signal Vdrv, and generates the control signal Vctrl and the selected result signal Vout to be both at a low logical level. This causes the first terminal A of the voltage source control switch 312 to be electrically disconnected from the second terminal B of the voltage source control switch 312 and causes the set logical level Vpad to remain at a low logical level. At this time, the stable working current Ivdd is ultra-low.

For the purpose of testing, when the reset pulse signal Vrst is inverted to a high logical level, the latch signal Vath is made to be at a high logical level and the driving signal Vdrv is made to be at a low logical level. The logical operational controller 314 operates the driving signal Vdrv, and generates the control signal Vctrl and the selected result signal Vout to be both at a high logical level. This causes the first terminal A of the voltage source control switch 312 to be electrically connected to the second terminal B of the voltage source control switch 312. Since the fuse 311 is in the untrimmed state, the set logical level Vpad remains at a low logical level. At this time, a dissipating working current Ivdd is present. Then, when the reset pulse signal Vrst is returned to the normal low logical level, the signals of the fuse option circuit 31 is returned to the initial state through the latch 313. At this time, the stable working current Ivdd is ultra-low.

Figure 3B:
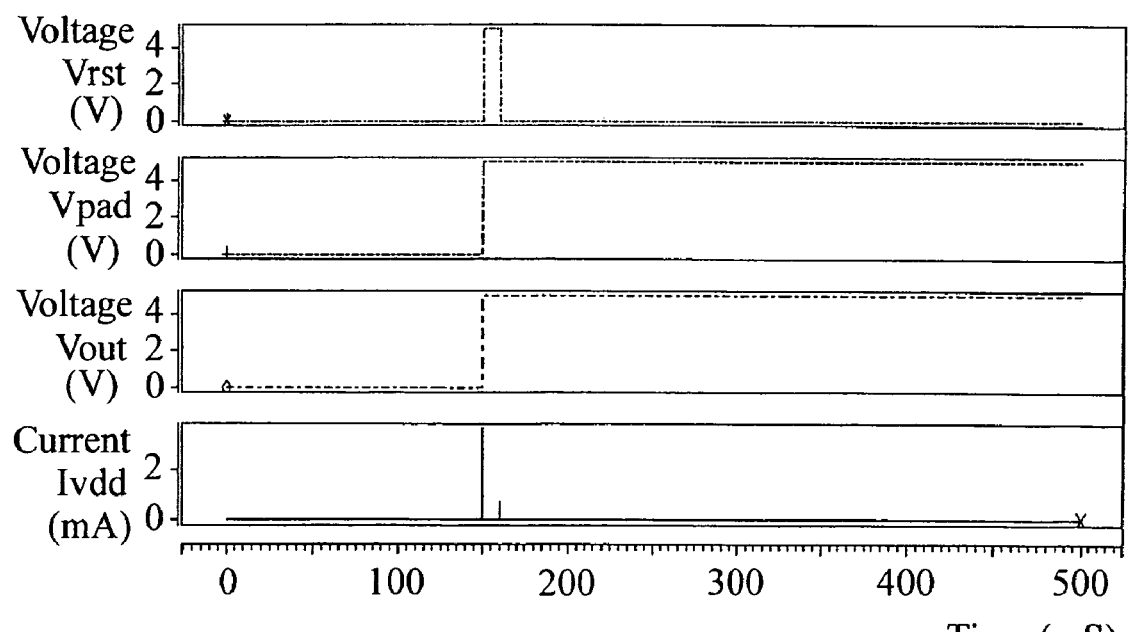
FIG. 3B is a waveform diagram showing signals where the fuse is in a trimmed state according to the first embodiment of the present invention.

Please refer to FIG. 3B, which is a waveform diagram showing signals where the fuse is in a trimmed state according to the first embodiment of the present invention. As FIG. 2 and FIG. 3B show, the fuse 31 is in the trimmed state. In order to establish the logical level of the selected result signal Vout, the reset input terminal RESET of the latch 313 receives a rising edge and the reset pulse signal Vrst is inverted to a high logical level. The latch signal Vath is made to be at a high logical level and the driving signal Vdrv is made to be at a low logical level. The logical operational controller 314 operates the driving signal Vdrv, and generates the control signal Vctrl and the selected result signal Vout to be both at a high logical level. This causes the first terminal A of the voltage source control switch 312 to be electrically connected to the second terminal B of the voltage source control switch 312 and causes the set logical level Vpad to remain at a high logical level.

Then, when the reset pulse signal Vrst is returned to a low logical level, the driving signal Vdrv remains at a low logical level through the latch 313, and the control signal Vctrl and the selected result signal Vout both remain at a high logical level. In the duration of the process, the stable working current Ivdd is ultra-low and power dissipation only exists at the moment the logical level of the reset pulse signal Vrst is inverted.

Figure 4:
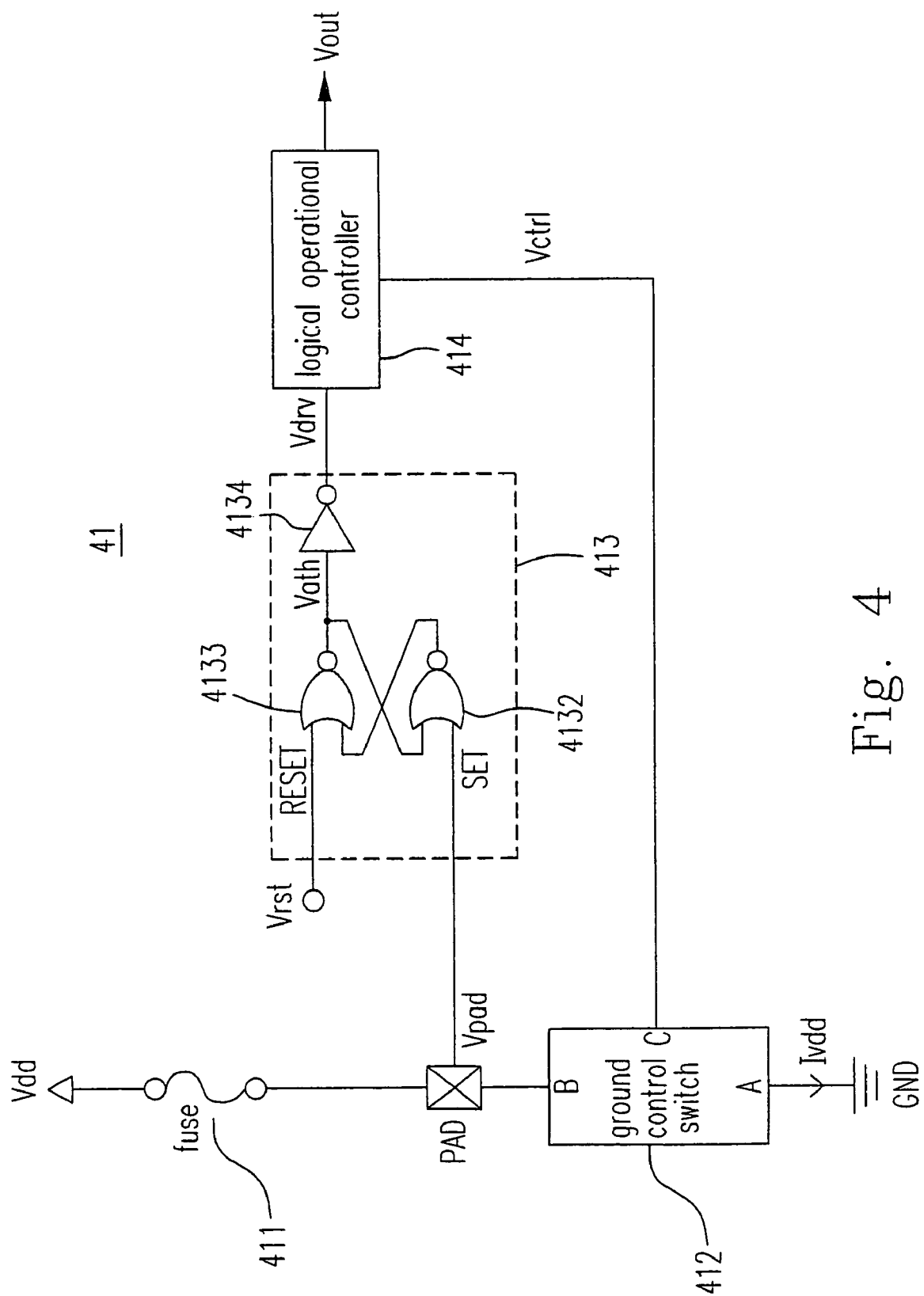
FIG. 4 is a circuit block diagram showing a fuse option circuit according to the second embodiment of the present invention.

Please refer to FIG. 4, which is a circuit block diagram showing a fuse option circuit according to the second embodiment of the present invention. As FIG. 4 shows, the fuse option circuit 41 includes a fuse 411, a ground control switch 412, a latch 413, and a logical operational controller 414. The fuse 411 is selectively coupled to a voltage source potential Vdd; that is, the fuse 411 is coupled to the voltage source potential Vdd when the fuse 411 is in an untrimmed state, and the fuse 411 is not coupled to the voltage source potential Vdd when the fuse 411 is in a trimmed state. The ground control switch 412 has a first terminal A, a second terminal B, and a control terminal C. The first terminal A is coupled to a ground potential GND. The second terminal B is coupled to the fuse 411. The control terminal C has a voltage level and selectively conducts the first terminal A and the second terminal B based on the voltage level. When the voltage level is a high logical level, the first terminal A is electrically connected to the second terminal B, and when the voltage level is a low logical level, the first terminal A is electrically disconnected from the second terminal B.

The latch 413 has a set input terminal SET and a reset input terminal RESET. The set input terminal SET is coupled to both the fuse 411 and the second terminal B of the ground control switch 412, and the common connection node is a welded pad PAD. The reset input terminal RESET receives a reset pulse signal Vrst. The latch 413 operates the reset pulse signal Vrst and outputs a driving signal Vdrv. The input terminal of the logical operational controller 414 is coupled to the latch 413 and receives the driving signal Vdrv. The first output terminal of the logical operational controller 414 is coupled to the control terminal C of the ground control switch 412. The logical operational controller 414 operates the driving signal Vdrv and outputs both a control signal Vctrl and a selected result signal Vout. The control signal Vctrl is output from the first output terminal and is fedback to the ground control switch 412. The selected result signal Vout is output from the second output terminal of the logical operational controller 414.

In FIG. 4, the latch 413 includes a first NOR gate 4132, a second NOR gate 4133, and a NOT gate 4134. The first NOR gate 4132 has a first input terminal, a first output terminal, and the set input terminal SET coupled to both the fuse 411 and the second terminal B of the ground control switch 412 for executing a NOR operation. The second NOR gate 4133 and the first NOR gate 4132 make up a bistable latch. The second NOR gate 4133 has the reset input terminal RESET receiving the reset pulse signal Vrst, a second input terminal electrically coupled to the first output terminal of the first NOR gate 4132, and a second output terminal coupled to the first input terminal of the first NOR gate 4132 for outputting a latch signal. The NOT gate 4134 is electrically coupled to the second NOR gate 4133 for stabilizing a voltage level of the latch signal Vath and inverting the latch signal Vath for generating the driving signal Vdrv.

Figure 5A:
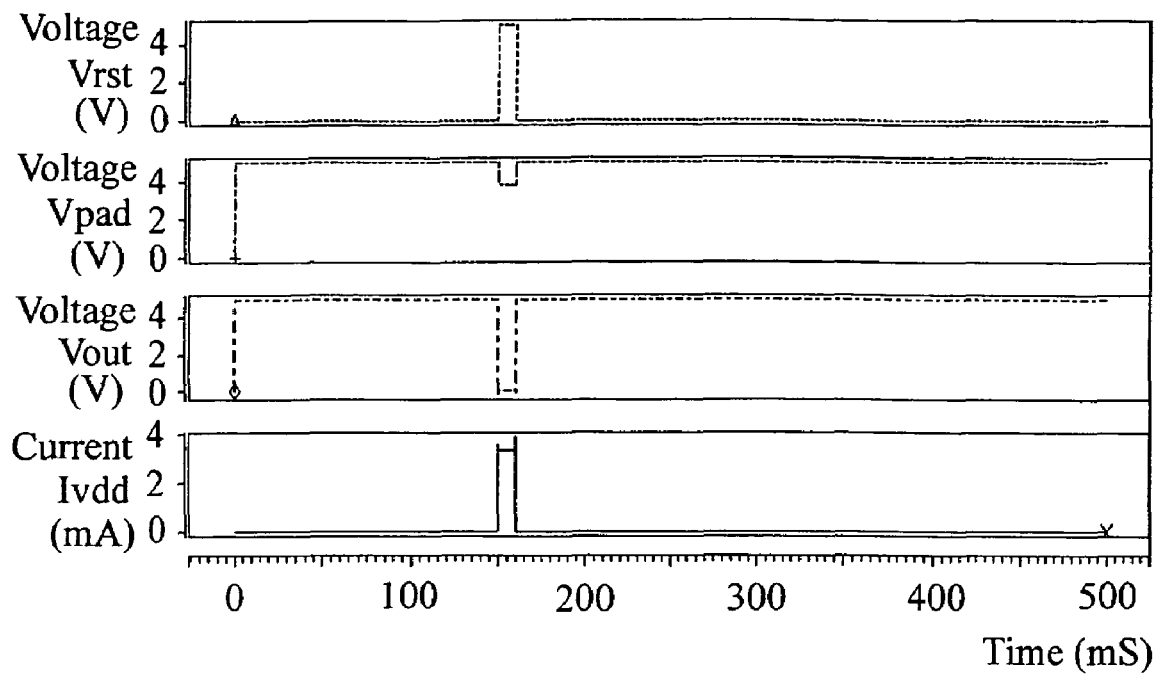
FIG. 5A is a waveform diagram showing signals where the fuse is in an untrimmed state according to the second embodiment of the present invention.

Please refer to FIG. 5A, which is a waveform diagram showing signals where the fuse is in an untrimmed state according to the second embodiment of the present invention. As FIG. 4 and FIG. 5A show, the fuse 411 is in the untrimmed state. In an initial state, the reset pulse signal Vrst is at a low logical level. A set logical level Vpad is a high logical level through the fuse 411, which causes the latch signal Vath to be at a high logical level and the driving signal Vdrv to be at a low logical level. The logical operational controller 414 operates the driving signal Vdrv, and generates the control signal Vctrl to be at a low logical level and the selected result signal Vout to be at a high logical level. This causes the first terminal A of the ground control switch 412 to be electrically disconnected from the second terminal B of the ground control switch 412 and causes the set logical level Vpad to remain at a high logical level. At this time, the stable working current Ivdd is ultra-low.

For the purpose of testing, when the reset pulse signal Vrst is inverted to a high logical level, the latch signal Vath is made to be at a low logical level and the driving signal Vdrv is made to be at a high logical level. The logical operational controller 414 operates the driving signal Vdrv, and generates the control signal Vctrl to be at a high logical level and the selected result signal Vout to be at a low logical level. This causes the first terminal A of the ground control switch 412 to be electrically connected to the second terminal B of the ground control switch 412. Since the fuse 411 is in the untrimmed state, the set logical level Vpad remains at a high logical level. At this time, a dissipating working current Ivdd is present. Then, when the reset pulse signal Vrst is returned to the normal low logical level, the signals of the fuse option circuit 41 is returned to the initial state through the latch 413. At this time, the stable working current Ivdd is ultra-low.

Figure 5B:
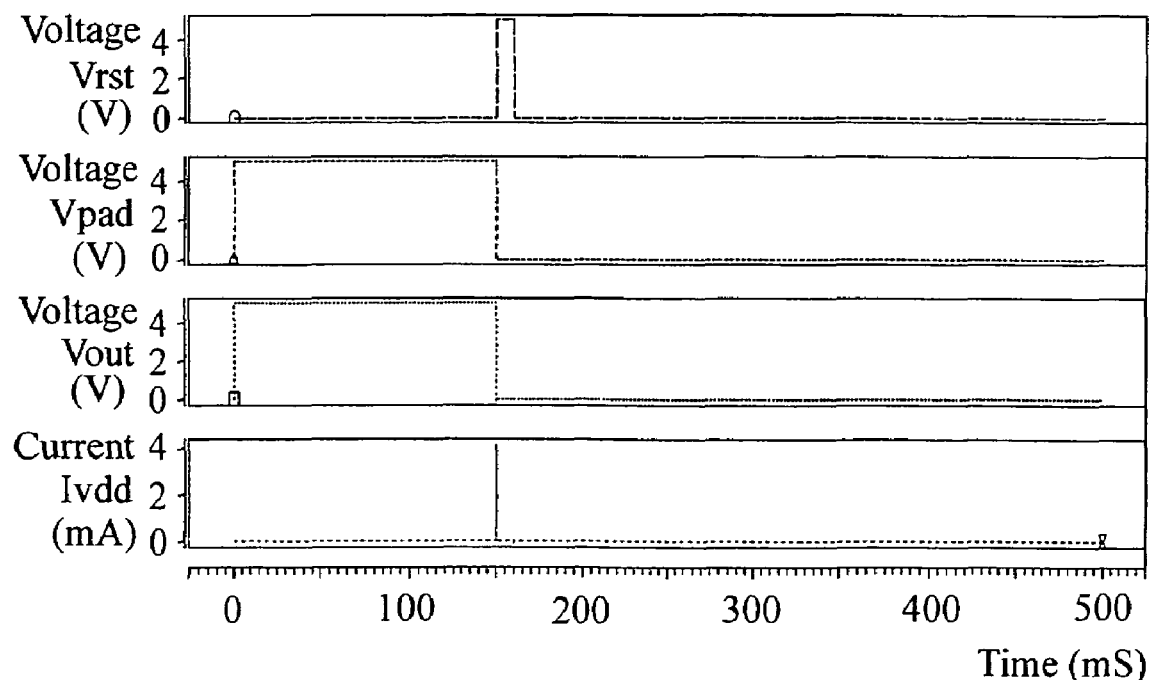
FIG. 5B is a waveform diagram showing signals where the fuse is in a trimmed state according to the second embodiment of the present invention.

Please refer to FIG. 5B, which is a waveform diagram showing signals where the fuse is in a trimmed state according to the second embodiment of the present invention. As FIG. 4 and FIG. 5B show, the fuse 411 is in the trimmed state. In order to establish the logical level of the selected result signal Vout, the reset input terminal RESET of the latch 413 receives a rising edge and the reset pulse signal Vrst is inverted to a high logical level. The latch signal Vath is made to be a low logical level and the driving signal Vdrv is made to be a high logical level. The logical operational controller 414 operates the driving signal Vdrv, and generates the control signal Vctrl to be at a high logical level and the selected result signal Vout to be at a low logical level. This causes the first terminal A of the ground control switch 412 to be electrically connected to the second terminal B of the ground control switch 412 and causes the set logical level Vpad to remain at a low logical level.

Then, when the reset pulse signal Vrst is returned to a low logical level, the driving signal Vdrv remains at a high logical level through the latch, the control signal Vctrl remains at a high logical level, and the selected result signal Vout remains at a low logical level. In the duration of the process, the stable working current Ivdd is ultra-low and power dissipation only exists at the moment the logical level of the reset pulse signal Vrst is inverted.

In conclusion, the main object of the present invention is to provide a fuse option circuit including a fuse, a control switch, a latch, and a logical operational controller. The latch stores a selected level. The logical operational controller outputs a selected result signal and feedbacks a control signal to the control switch. The level of the control signal determines whether the control switch is on or off. Therefore, the required level is input to the latch and the working mode having an ultra low current is selected. Furthermore, when the fuse is in an untrimmed state, the level of the selected result signal could be selected by a reset pulse signal of the latch in order to test a product. Afterward, it is determined whether the fuse is trimmed or not. When the fuse is in a trimmed state, the level of the selected result signal is established by a rising edge of the reset pulse signal.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A fuse option circuit, comprising:
   a fuse selectively coupled to a voltage source potential;
   a ground control switch which has a first terminal coupled to a ground potential, a second terminal coupled to the fuse, and a control terminal having a voltage level and selectively conducting the first terminal and the second terminal based on the voltage level;
   a latch having a set input terminal coupled to both the fuse and the ground control switch, and a reset input terminal receiving a reset pulse signal and outputting a driving signal; and
   a logical operational controller electrically coupled to the latch and the control terminal for outputting a control signal fedback to the ground control switch by operating the driving signal and outputting a selected result signal.

2. A fuse option circuit according to claim 1, wherein the latch further comprises:
   a first NOR gate having a first input terminal and a first output terminal, and coupled to both the fuse and the ground control switch for executing a NOR operation;
   a second NOR gate receiving the reset pulse signal and having a second input terminal electrically coupled to the first output terminal, and a second output terminal coupled to the first input terminal for forming a bistable latch with the first NOR gate and outputting a latch signal; and
   a NOT gate electrically coupled to the second NOR gate for stabilizing a voltage level of the latch signal and inverting the latch signal for generating the driving signal.

3. A fuse option circuit according to claim 1, wherein when the fuse is coupled to the voltage source potential, a logical level inverted state of the reset pulse signal causes a logical level of the driving signal to be inverted.

4. A fuse option circuit according to claim 1, wherein when the fuse is not coupled to the voltage source potential, a rising edge of the reset pulse signal causes an establishment of a logical level of the driving signal.

5. A fuse option circuit according to claim 1, wherein the control signal is in a state identical to the driving signal, and the selected result signal is an inverted state of the driving signal.

6. A fuse option circuit according to claim 1, wherein the logical operational controller comprises a first input terminal coupled to the latch, a first output terminal coupled to the control terminal for outputting a control signal fedback to the ground control switch, and a second output terminal for outputting a selected result signal.

7. A fuse option circuit according to claim 1, wherein when the voltage level is a high logical level, the first terminal is electrically connected to the second terminal, and when the voltage level is a low logical level, the first terminal is electrically disconnected from the second terminal.

* * * * *